United States Patent
Elliott et al.

(10) Patent No.: US 6,870,243 B2
(45) Date of Patent: Mar. 22, 2005

(54) THIN GAAS DIE WITH COPPER BACK-METAL STRUCTURE

(75) Inventors: Alexander James Elliott, Tempe, AZ (US); Jeffrey Dale Crowder, Phoenix, AZ (US); Monte Gene Miller, Phoenix, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/306,834

(22) Filed: Nov. 27, 2002

(65) Prior Publication Data

US 2004/0099932 A1 May 27, 2004

(51) Int. Cl.[7] .................. H01L 29/40; H01L 23/48; H01L 23/495; H01L 27/095
(52) U.S. Cl. ............... 257/666; 257/669; 257/675; 257/762; 257/782; 257/473; 257/763; 257/784; 257/786; 257/758; 257/700; 257/701
(58) Field of Search .................. 257/666, 669, 257/696, 698, 473, 692, 693, 700, 701, 758, 762, 763, 667, 784, 786, 787

(56) References Cited

U.S. PATENT DOCUMENTS

| | | | | |
|---|---|---|---|---|
| 3,755,720 A | * | 8/1973 | Kern | 257/794 |
| 3,942,186 A | * | 3/1976 | McAvoy et al. | 257/275 |
| 4,321,099 A | * | 3/1982 | Frosch et al. | 438/89 |
| 4,543,442 A | * | 9/1985 | Alcorn et al. | 136/255 |
| 4,872,047 A | * | 10/1989 | Fister et al. | 257/747 |
| 4,989,117 A | * | 1/1991 | Hernandez | 361/306.2 |
| 5,528,076 A | * | 6/1996 | Pavio | 257/666 |
| 5,545,289 A | * | 8/1996 | Chen et al. | 438/694 |
| 5,622,305 A | * | 4/1997 | Bacon et al. | 228/123.1 |
| 5,821,154 A | | 10/1998 | Nashimoto et al. | |
| 6,010,966 A | * | 1/2000 | Ionov | 438/706 |
| 6,426,289 B1 | * | 7/2002 | Farrar | 438/670 |
| 6,583,500 B1 | * | 6/2003 | Abbott et al. | 257/666 |
| 6,646,344 B1 | * | 11/2003 | Okamoto et al. | 257/746 |
| 2002/0114726 A1 | * | 8/2002 | Soga et al. | 420/557 |
| 2002/0186583 A1 | * | 12/2002 | Tuttle | 365/171 |
| 2004/0016984 A1 | * | 1/2004 | Lee et al. | 257/473 |

FOREIGN PATENT DOCUMENTS

EP 0194475 A2 9/1986
EP 1063701 A2 12/2000

OTHER PUBLICATIONS

T. Grebs et al., "The Use of Copper Based Backmetal Schemes as a Low Stress and Low Thermal Resistance Alternative for Use in Thin Substrate Power Devices," Electrochemical Society Proceedings vol. 99–9, New York, NY, pp. 185–193, May 3, 1999.

C.Y. Chen et al., "Backside copper metallisation of AsAs MESFETs," Electronic Letters, vol. 35, No. 15, 2 pp., Jul. 20, 2000.

Backside Copper Metallization of GaAs MESFET . . . , Jun. 2001.

* cited by examiner

Primary Examiner—Alexander Oscar Williams
(74) Attorney, Agent, or Firm—Toler, Larson & Abel, LLP

(57) ABSTRACT

A thin GaAs Substrate can be provided with a copper back-metal layer to allow the GaAs Substrate to be packaged using conventional plastic packaging technologies. By providing the GaAs Substrate with a copper back-metal layer, the GaAs Substrate can be made thinner than 2 mils (about 50 microns), thereby reducing heat dissipation problems and allowing the semiconductor die to be compatible with soft-solder technologies. By enabling the semiconductor die to be packaged in a plastic package substantial cost savings can be achieved.

17 Claims, 2 Drawing Sheets

THIN GAAS DIE WITH COPPER BACK-METAL STRUCTURE

FIELD OF THE DISCLOSURE

This invention relates generally to semi-conductor devices, and more particularly to Gallium Arsenide (GaAs) semiconductor devices.

BACKGROUND

Two of the most common types of semiconductor die packages currently used are plastic packages and ceramic packages. Ceramic packages are preferred over plastic packages in some instances (e.g. when hemeticity and/or high frequency is required), but plastic packages are generally preferred over ceramic packages because plastic packages are less expensive.

Plastic packages are routinely used to package silicon die, however, attempts to package GaAs semiconductor die in plastic packages have proven somewhat problematic. For example, although relatively thick GaAs die (i.e. those die having a thickness greater than about 3 mils) can be packaged in plastic, power dissipation characteristics of thick GaAs die limit the maximum power capabilities that can be implemented.

In order to overcome the power dissipation problems and allow more complex circuits, attempts have been made to reduce the thickness of the GaAs die to less than 3 mils. However, the die handling processes associated with packaging are incompatible with thin, i.e. less than 3 mils, GaAs die. The use of a thick, about 18 $\mu$m, gold back metal layer has been proposed in an attempt to strengthen GaAs die thinned for power dissipation purposes. Unfortunately, the thick gold back-metal layer is incompatible with plastic packaging processes for at least two reasons: 1) the thick gold causes embrittlement of the soft-solder used in plastic packaging processes to attach the semiconductor die to the leadframe; and 2) gold tends to de-laminate from a plastic package.

What is needed, therefore, is away to allow high-powered GaAs semiconductor die to be used in plastic packages. By allowing a high-powered semiconductor die to be used in a plastic package, substantial cost savings could be achieved without performance loss.

BRIEF DESCRIPTION OF THE DRAWINGS

Various advantages, features and characteristics of the present disclosure, as well as methods, operation and functions of related elements of structure, and the combination of parts and economies of manufacture, will become apparent upon consideration of the following description and claims with reference to the accompanying drawings, all of which form a part of this specification.

DETAILED DESCRIPTION OF THE FIGURES

Figure 1:
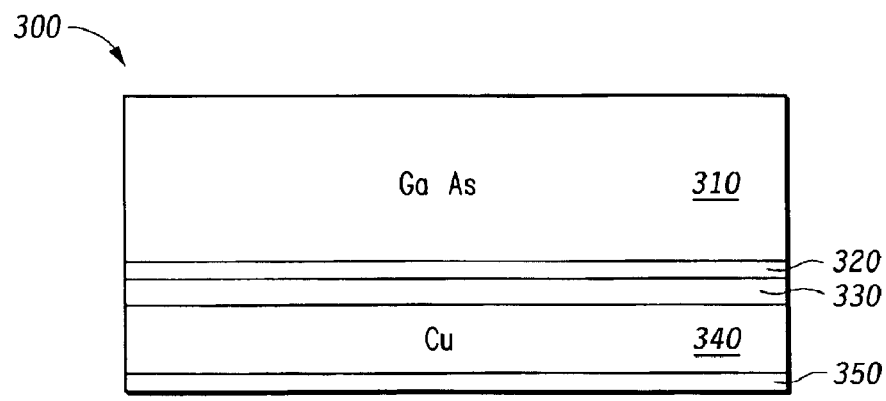
FIG. 1 is a diagram of a thin GaAs semiconductor die having a copper back-metal structure according to an embodiment of the present disclosure.
Figure 2:
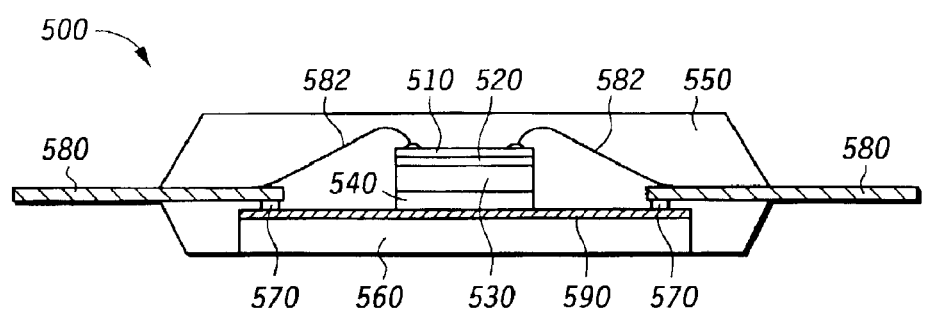
FIG. 2 is a thin GaAs die having a copper back-metal structure encapsulated in a plastic package according to an embodiment of the present disclosure.
Figure 3:
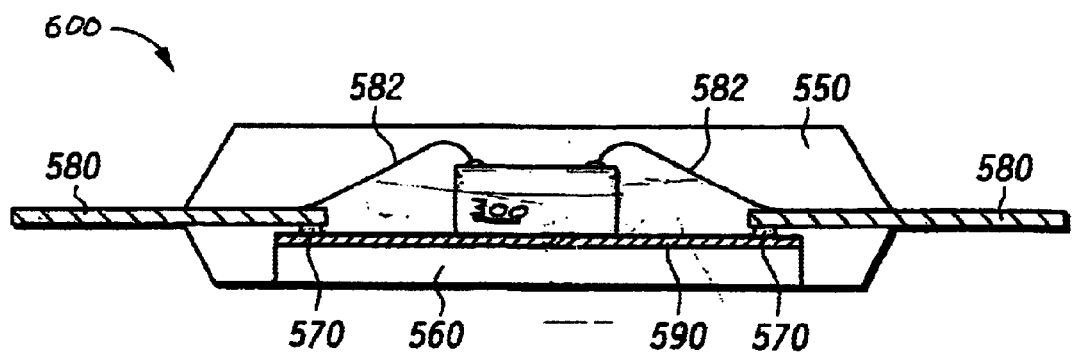
FIG. 3 is the thin GaAs die of FIG. 1 encapsulated in a plastic package according to an embodiment of the present disclosure.

FIGS. 1–3 illustrate a thin GaAs die with a copper back-metal structure suitable for use in a plastic package, in accordance with the present disclosure. In certain embodiments, various anti-stress and oxidation resistant layers are shown in addition to the copper back-metal layer. FIG. 2 illustrates a completed semiconductor die encapsulated in a plastic package. FIG. 3 illustrates the die of FIG. 1 in the plastic package of FIG. 2 By providing a copper back-metal structure, a thin, high power, GaAs semiconductor die can be used in a plastic package. In general, the GaAs substrate is less than 2 mils (about 50 microns) thick, and particular embodiments of the GaAs substrate of the semiconductor die have thicknesses of approximately 1–2 mils (about 25–50 microns), less than approximately 1.5 mils (about 38 microns), or less than or equal to approximately 1 mil (about 25 microns). Approximately (and about), as used herein, generally refers to process limitations. For example, if a particular process for polishing a semiconductor substrate is conventionally performed to within 10 percent of the desired process parameter, then a substrate having a nominal thickness of approximately 1 mil (about 25 microns) will have an actual thickness of 0.9 mils (about 22 microns) to 1.1 mils (about 28 microns).

The copper back-metal layer provides both mechanical strength and improved heat dissipation properties to the GaAs die, and makes the GaAs die compatible with soft-solder die attach technologies. Soft solder die attach refers to die attach methods using soft solders that generally comprise about 5% tin and 95% lead. Since soft-solder die attached methods are used when preparing a semiconductor die for encapsulation in a plastic package, the thin GaAs substrate with copper back-metal layer can be packaged in a plastic package.

In discussing the structure of the semiconductor die illustrated in FIGS. 1–2, it will be appreciated that various processes known to those skilled in the art may be used in constructing the thin GaAs semiconductor die, the copper back-metal layer and other layers used for mechanical stress reduction, oxidation resistance, etc. The various layers described may be deposited using conventional sputtering, coating, crystalline growth, implantation, and/or other appropriate methods known to those skilled in the art.

Referring now to FIG. 1, a thin GaAs semiconductor die with a copper back-metal layer will be discussed, wherein the semiconductor die is designated generally as Die 300. Die 300 includes a GaAs Substrate 310 in which a semiconductor circuit is formed using methods known to those skilled in the art. While not shown in FIG. 1, GaAs Substrate 310 may also include various interconnection terminals on top of GaAs Substrate 310 for connecting Die 300 to leads during the packaging process. A Diffusion Barrier 320 is formed over the bottom of GaAs Substrate 310, such that any subsequent layers formed over Diffusion Barrier 320 will not adversely impact the semiconductor circuits within GaAs Substrate 310. In at least one embodiment, Diffusion Barrier 320 includes an adhesion metal such as tantalum deposited in the form of tantalum nitride, or another suitable diffusion barrier known to those skilled in the art.

It will be appreciated that the term "over" or "overlying" is used to describe a layer formed completely or partially over another layer or surface. For purposes of discussion herein the term "overlying" is used irrespective of the surface of the substrate on which overlying layer is formed. For example, a layer formed on the backside surface of a substrate and a layer formed on an active surface of a substrate are both considered to be overlying the substrate.

A Stress Relief Layer 330 is formed over Diffusion Barrier 320 in at least one embodiment. Stress Relief Layer 330 provides protection for GaAs Substrate 310 and or diffusion layer 320 from uneven expansion, contraction or other physical movements of a back-metal or other layer overlying Stress Relief Layer 330. In at least one embodiment gold is used as a stress relief layer. While FIG. 1 illustrates a single stress relief layer, using more than one stress relief layer does not depart from the spirit and scope of the present invention.

On top of Stress Relief Layer 330, a Copper Back-metal Layer 340 is formed. Copper Back-metal Layer 340 has a thickness chosen to be sufficient to provide the necessary support for GaAs Substrate 310 during the packaging process, including the process of soft-solder die attach. For example, a 3-mil-thick (about 76 microns) GaAs die needs very little, if any, additional mechanical support. Consequently, a 3-mil-thick (about 76 microns) GaAs die may not include Copper Back-metal Layer 340. However, a 1 mil thick (about 25 microns) GaAs die may include a Copper Back-metal layer 340 having a thickness of between about 1–15 microns to provide the additional mechanical support.

An appropriate thickness for Copper Back-metal Layer 340 can be selected empirically. For example, if it is known that 18–19 microns of gold are needed to provide adequate mechanical strength for a 25 micron thick GaAs die, then using the known physical properties of gold and copper, for example tensile strength, malleability, etc., the thickness of copper needed to provide an equivalent mechanical stability can be calculated.

In addition to mechanical support, Copper Metal Back layer 340 provides improved heat dissipation as compared to a thick GaAs substrate. As a result, GaAs Substrate 310 can be made thinner and still dissipate enough heat through the use of the Copper Metal Back layer 340 to support high power circuits formed overlying the thin GaAs Substrate 310. Those skilled in the art can readily calculate the amount of heat dissipation required by the circuits, and incorporate that information in their decision regarding the thickness of Copper Back-metal Layer 340.

Finally, an Oxidation Resistant Layer 350 is formed over Copper Back-metal Layer 340 to prevent oxidation of Copper Back-metal Layer 340. Oxidation of Copper Back-metal Layer 340 is undesirable, since oxidation can adversely affect both the electrical and heat transfer properties of Copper Back-metal Layer 340. In addition, the oxidation can adversely affect the bonding of Copper Back-metal layer 340 to the packaging (e.g. to the solder). In at least one embodiment, Oxidation Resistant layer 350 is a thin layer of gold about 1500 Angstroms thick, which is referred to as a flash of gold. It will be appreciated that the thickness of Oxidation Resistant Layer 350 should be limited, particularly when gold is used, because solder embrittlement may occur due to soft-solder attachment of pie 300 to a lead frame if the Oxidation Resistant Layer 350 is formed too thick.

The semiconductor die shown in FIG. 1 is compatible with soft-solder die attach processes that are commonly used during packaging operations. In at least one embodiment, the GaAs Substrate 310 is less than 2 mils thick, thereby allowing a relatively high power circuit to be formed in GaAs Substrate 310. In other embodiments, GaAs Substrate 310 is less than 1 mil thick, and in at least one embodiment, GaAs Substrate 410 is nominally 1 mil (about 25 microns). The use of Copper Back-metal Layer 340 also permits Die 300 to be packaged in a plastic package, because Semiconductor Die 300 is compatible with soft-solder die attach methods.

Referring next to FIG. 2 a semiconductor die having a thin GaAs substrate and a copper back-metal layer illustrated inside of a plastic package according to an embodiment of the present invention. The packaged die will be referred to as Plastic Die Package 500. The semiconductor die illustrated in FIG. 2 includes a thin GaAs Substrate 510 (in one embodiment having a thickness in the range 15–35 microns), a Diffusion Barrier 520, a Copper Back-metal Layer 530 and an Oxidation Resistant Layer 540. The semiconductor die is attached to Flag 560 using a soft-solder die attach method. Flag 560 is coated with Soft-solder Layer 590. Soft-solder Layer 590 is a layer of soft-solder, which in at least one embodiment comprises 5% tin and 95% lead. In alternate embodiments, eutectic solder or conductive epoxies can be used.

In order to attach the semiconductor die to Flag 560, Soft-solder Layer 590 is heated, and brought into contact with the oxidation resistant layer 540 of the semiconductor die. The Oxidation Resistant Layer 540, a portion of the Copper Back-metal Layer 530 and Soft-solder Layer 590 melt such that the components of each of the layers intermingle with the others to form a solder joint when the heat is removed and the materials are allowed to cool. In at least one embodiment, when the solder process is complete, Soft-solder Layer 590 is adjacent to Copper Back-metal Layer 530, and the material in Oxidation Resistant Layer 540 (e.g. gold) is present within Soft-solder Layer 590, and at the interface between Soft-solder Layer 590 and Copper Back-metal Layer 530. Once the semiconductor die is attached to Flag 560, Flag 560 can provide an excellent thermal sink for the semiconductor die.

After the semiconductor die is attached to Flag 560, Bonding Wires 582 are bonded to the die and Bonding Fingers 580, and then the assembly is in a mold die Usually a plurality of such assemblies, e.g. as exist in a lead frame, is placed in a mold die. A thermoset plastic compound is transferred into a cavity of the mold die to encapsulate the semiconductor die, thus forming a completed semiconductor package such as Plastic die Package 500. The thermoset plastic may be cured, and further processing (e.g. lead trim and form, package marking, and test) occur in a conventional manner.

In summary, then, a thin GaAs Substrate can be provided with a copper back-metal layer to allow the GaAs Substrate to be packaged using conventional plastic packaging technologies. By providing the GaAs Substrate with a copper metal back layer, the GaAs substrate can be made thinner than 2 mils (about 50 microns), thereby reducing heat dissipation problems as well as allowing the semiconductor die to be compatible with soft-solder techniques. By enabling the semiconductor die to be packaged in a plastic package substantial cost savings can be achieved.

In the preceding detailed description of the figures, reference has been made to the accompanying drawings, which form a part thereof, and in which is shown by way of illustration specific embodiments in which the invention may be practiced. These embodiments are described in sufficient detail to enable those skilled in the art to practice the disclosure, and it is to be understood that other embodiments may be utilized and that logical, mechanical, chemical, and electrical changes may be made without departing from the spirit or scope of the disclosure. Furthermore, many other varied embodiments that incorporate the teachings of the disclosure may be easily constructed by those skilled in the art. For example, additional diffusion layers and/or stress relief layers can be used in addition to those described. Accordingly, the present disclosure is not intended to be limited to the specific fort set forth herein, but on the contrary, it is intended to cover such alternatives, modifications, and equivalents, as can be reasonably included within the spirit and scope of the invention. The preceding detailed description is, therefore, not to be taken in a limiting sense, and the scope of the present disclosure is defined only by the appended claims.

What is claimed is:

1. A semiconductor device comprising:
   a GaAs substrate having a thickness of less than 50 microns, said GaAs substrate having an active surface and a backside surface;
   a diffusion barrier layer overlying the backside surface;
   a back-metal layer comprising copper and overlying the diffusion barrier; and
   a plastic die package encapsulating the GaAs substrate.

2. The semiconductor device as in claim 1, wherein said GaAs substrate has a thickness of between approximately 15 microns and 50 microns.

3. The semiconductor device as in claim 1, wherein said GaAs substrate has a thickness of approximately 25 microns.

4. The semiconductor device as in claim 1, wherein said GaAs substrate has a thickness of less than approximately 25 microns.

5. The semiconductor device as in claim 1, wherein said diffusion barrier comprises tantalum.

6. The semiconductor device as in claim 1, wherein said semiconductor device further comprises an anti-oxidation layer overlying the back-metal layer.

7. The semiconductor device as in claim 6, wherein said anti-oxidation layer comprises gold.

8. The semiconductor device as in claim 6, wherein the back metal layer has a thickness in the range of 11 microns to 15 microns.

9. The semiconductor device as in claim 6, further comprising a solder attaching the GaAs substrate to a lead frame, wherein the solder is adjacent to the back metal layer.

10. The semiconductor device as in claim 9, wherein gold is present at an interface between the solder and the back metal layer.

11. A semiconductor device comprising:
    a GaAs substrate having a thickness of between approximately 15 microns and 50 microns, said GaAs substrate having an active surface and a backside surface;
    a diffusion barrier layer overlying the backside surface; and
    a back-metal layer comprising copper overlying the diffusion barrier, the back-metal layer having a nominal thickness of about 11 microns to about 15 microns.

12. The semiconductor device as in claim 11, further comprising a plastic die package.

13. The semiconductor device as in claim 11, further comprising an oxidation resistant layer overlying said back-metal layer.

14. The semiconductor device as in claim 11, further comprising a stress relief layer disposed between the diffusion barrier and the back-metal layer.

15. The semiconductor device as in claim 11, wherein the back-metal layer provides mechanical support to the GaAs substrate.

16. A semiconductor device comprising:
    a GaAs substrate having a thickness of less than 50 microns, the GaAs substrate having an active surface and a backside surface;
    a diffusion barrier layer overlying the backside surface;
    a stress relief layer overlying the diffusion barrier;
    a back-metal layer comprising copper and overlying the stress relief layer; and
    a plastic die package encapsulating the GaAs substrate.

17. A semiconductor device comprising:
    a GaAs substrate having a thickness of less than 50 microns, said GaAs substrate having an active surface and a backside surface;
    a diffusion barrier layer overlying the backside surface;
    a back-metal layer comprising copper and overlying the diffusion barrier, the back-metal layer to provide mechanical support for the GaAs substrate; and
    a plastic die package encapsulating the GaAs substrate.

* * * * *